United States Patent
Wang et al.

(10) Patent No.: US 10,634,746 B2
(45) Date of Patent: Apr. 28, 2020

(54) NMR MEASURED PORE FLUID PHASE BEHAVIOR MEASUREMENTS

(71) Applicant: Chevron U.S.A. Inc., San Ramon, CA (US)

(72) Inventors: Haijing Wang, Sugar Land, TX (US); Boqin Sun, Houston, TX (US); Scott J. Seltzer, Houston, TX (US); John S. Zintsmaster, Benicia, CA (US); Hussein Alboudwarej, San Ramon, CA (US)

(73) Assignee: CHEVRON U.S.A. INC., San Ramon, CA (US)

( * ) Notice: Subject to any disclaimer, the term of this patent is extended or adjusted under 35 U.S.C. 154(b) by 239 days.

(21) Appl. No.: 15/472,897

(22) Filed: Mar. 29, 2017

(65) Prior Publication Data

US 2017/0285215 A1 Oct. 5, 2017

Related U.S. Application Data

(60) Provisional application No. 62/314,802, filed on Mar. 29, 2016.

(51) Int. Cl.
G01R 33/46 (2006.01)
G01R 33/31 (2006.01)

(52) U.S. Cl.
CPC .............. *G01R 33/46* (2013.01); *G01R 33/31* (2013.01)

(58) Field of Classification Search
CPC ................................. G01R 33/31; G01R 33/46
USPC ............ 324/200–322; 600/407–435; 703/10
See application file for complete search history.

(56) References Cited

U.S. PATENT DOCUMENTS

| 3,721,658 A | 3/1973 | Dickakian |
| 4,710,713 A | 12/1987 | Strikman |
| 4,717,876 A | 1/1988 | Masi et al. |
| 4,717,877 A | 1/1988 | Taicher et al. |

(Continued)

FOREIGN PATENT DOCUMENTS

| CN | 102062742 A | 5/2011 |
| EP | 1397661 B1 | 9/2008 |

(Continued)

OTHER PUBLICATIONS

Akkurt, R., et al.; "NMR Logging of Natural Gas Reservoirs"; (1996), The Log Analyst, pp. 33-42.

(Continued)

*Primary Examiner* — Gregory H Curran

(57) ABSTRACT

To measure the phase behavior of a fluid in a porous medium such as a tight gas shale, one illustrative method involves: (a) loading the fluid into a sample cell containing the porous medium; (b) setting a pressure and a temperature for the fluid in the sample cell; (c) applying an RF pulse sequence to the fluid in the sample cell to acquire an NMR signal; (d) deriving from the NMR signal an NMR parameter distribution that depends on the pressure and the temperature; (e) determining whether a fluid phase is present based on the NMR parameter distribution; (f) repeating operations (c) through (f) to determine the presence or absence of the fluid phase at multiple points along a pressure-temperature path that crosses a phase boundary; and (g) providing an estimated location of the phase boundary based on the presence or absence of the fluid phase at said points.

20 Claims, 8 Drawing Sheets

Comparison between the newly measured phase boundary [803] of pore fluids from the acquired NMR signal, and the simulated phase boundary [802] of bulk fluids based on a theoretical model.

802: Simulated phase boundary of bulk fluids without measurement
803: Newly measured phase boundary of pore fluids
804: Bulk fluid cricondentherm
806: Bulk fluid cricondenbar
808: Pressure-temperature measurement path
810-834: Pressure-temperature measurement points

(56) References Cited

U.S. PATENT DOCUMENTS

| | | |
|---|---|---|
| 4,717,878 A | 1/1988 | Taicher et al. |
| 4,827,761 A | 5/1989 | Vinegar et al. |
| 5,023,551 A | 6/1991 | Kleinberg et al. |
| 5,055,787 A | 10/1991 | Kleinberg et al. |
| 5,055,788 A | 10/1991 | Kleinberg et al. |
| 5,200,699 A | 4/1993 | Baldwin et al. |
| 5,212,447 A | 5/1993 | Paltiel |
| 5,280,243 A | 1/1994 | Miller |
| 5,291,137 A | 3/1994 | Freedman |
| 5,309,098 A | 5/1994 | Coates et al. |
| 5,363,041 A | 11/1994 | Sizginer |
| 5,381,092 A | 1/1995 | Freedman |
| 5,412,320 A | 5/1995 | Coates |
| 5,486,762 A | 1/1996 | Freedman et al. |
| 5,517,115 A | 5/1996 | Prammer |
| 5,557,200 A | 9/1996 | Coates |
| 5,585,720 A | 12/1996 | Edwards |
| 5,680,043 A | 10/1997 | Hurlimann et al. |
| 5,696,448 A | 12/1997 | Coates et al. |
| 5,796,252 A | 8/1998 | Kleinberg et al. |
| 5,936,405 A | 8/1999 | Prammer et al. |
| 6,005,389 A | 12/1999 | Prammer |
| 6,032,101 A | 2/2000 | Freedman et al. |
| 6,049,205 A | 4/2000 | Taicher et al. |
| 6,069,477 A | 5/2000 | Chen et al. |
| 6,070,662 A | 6/2000 | Ciglenec et al. |
| 6,072,314 A | 6/2000 | Oraby |
| 6,114,851 A | 9/2000 | Kruspe et al. |
| 6,133,735 A | 10/2000 | Hurlimann et al. |
| 6,147,489 A | 11/2000 | Freedman et al. |
| 6,166,543 A | 12/2000 | Sezginer et al. |
| 6,255,818 B1 | 7/2001 | Heaton et al. |
| 6,316,940 B1 | 11/2001 | Akkurt |
| 6,344,744 B2 | 2/2002 | Taicher et al. |
| 6,366,087 B1 | 4/2002 | Coates et al. |
| 6,369,567 B1 | 4/2002 | Song et al. |
| 6,429,653 B1 | 8/2002 | Kruspe et al. |
| 6,462,542 B1 | 10/2002 | Venkataramanan et al. |
| 6,477,516 B1 | 11/2002 | Colaiocco et al. |
| 6,492,809 B1 | 12/2002 | Speier et al. |
| 6,522,136 B1 | 2/2003 | Hurlimann et al. |
| 6,559,639 B2 | 5/2003 | Minh et al. |
| 6,559,640 B2 | 5/2003 | Taicher |
| 6,570,382 B1 | 5/2003 | Hurlimann et al. |
| 6,573,715 B2 | 6/2003 | King et al. |
| 6,577,125 B2 | 6/2003 | Prammer et al. |
| 6,583,621 B2 | 6/2003 | Prammer et al. |
| 6,597,171 B2 | 7/2003 | Hurlimann et al. |
| 6,745,833 B2 | 6/2004 | Aronstam et al. |
| 6,833,699 B2 | 12/2004 | Galford et al. |
| 6,859,032 B2 | 2/2005 | Heaton et al. |
| 6,923,273 B2 | 8/2005 | Terry et al. |
| 6,937,014 B2 | 8/2005 | Sun et al. |
| 6,959,246 B2 | 10/2005 | Herron |
| 6,977,499 B2 | 12/2005 | Kiesl et al. |
| 6,984,980 B2 | 1/2006 | Kruspe et al. |
| 7,172,038 B2 | 2/2007 | Terry et al. |
| 7,193,414 B2 | 3/2007 | Kruspe et al. |
| 7,398,837 B2 | 7/2008 | Hall et al. |
| 7,452,930 B2 | 11/2008 | Kawakami et al. |
| 7,605,716 B2 | 10/2009 | Peter et al. |
| 7,624,794 B2 | 12/2009 | Freedman et al. |
| 7,683,613 B2 | 3/2010 | Freedman et al. |
| 7,733,086 B2 | 6/2010 | Prammer et al. |
| 7,755,354 B2 | 7/2010 | Akkurt |
| 7,893,692 B2 | 2/2011 | Minh |
| 7,931,784 B2 | 4/2011 | Medoff |
| 8,016,105 B2 | 9/2011 | Kirkwood et al. |
| 8,236,535 B2 | 8/2012 | Medoff et al. |
| 8,454,803 B2 | 6/2013 | Medoff et al. |
| 8,518,683 B2 | 8/2013 | Medoff et al. |
| 8,709,771 B2 | 4/2014 | Medoff et al. |
| 8,747,624 B2 | 6/2014 | Medoff |
| 8,764,948 B2 | 7/2014 | Medoff |
| 8,771,480 B2 | 7/2014 | Medoff |
| 8,852,896 B2 | 10/2014 | Medoff |
| 9,023,183 B2 | 5/2015 | Medoff |
| 9,109,241 B2 | 8/2015 | Medoff et al. |
| 9,138,715 B2 | 9/2015 | Medoff |
| 9,186,646 B2 | 11/2015 | Medoff |
| 9,244,188 B2 | 1/2016 | Sun et al. |
| 9,290,780 B2 | 3/2016 | Medoff et al. |
| 9,352,294 B1 | 5/2016 | Medoff |
| 9,482,631 B2 | 11/2016 | Yang et al. |
| 2002/0067164 A1 | 6/2002 | Venkataramanan et al. |
| 2002/0105326 A1 | 8/2002 | Hurlimann et al. |
| 2003/0094946 A1 | 5/2003 | Galford et al. |
| 2003/0155915 A1 | 8/2003 | Kruspe et al. |
| 2004/0169511 A1 | 9/2004 | Minh et al. |
| 2004/0189296 A1 | 9/2004 | Sun et al. |
| 2005/0030021 A1 | 2/2005 | Prammer et al. |
| 2009/0157350 A1 | 6/2009 | Salazar-Tio et al. |
| 2009/0256562 A1 | 10/2009 | Gao et al. |
| 2009/0302847 A1 | 12/2009 | Knizhnik |
| 2010/0156409 A1 | 6/2010 | Nikolin et al. |
| 2011/0050223 A1 | 3/2011 | Balcom et al. |
| 2011/0198078 A1 | 8/2011 | Harrigan et al. |
| 2011/0284231 A1 | 11/2011 | Becker |
| 2012/0092016 A1 | 4/2012 | Kruspe |
| 2012/0192640 A1 | 8/2012 | Minh et al. |
| 2012/0223235 A1 | 9/2012 | Maucec |
| 2013/0103627 A1 | 4/2013 | Maddinelli et al. |
| 2013/0293228 A1 | 11/2013 | Walsh et al. |
| 2014/0088878 A1 | 3/2014 | Chen et al. |
| 2014/0229112 A1 | 8/2014 | Datey et al. |
| 2014/0232391 A1 | 8/2014 | Kadayam Viswanathan et al. |
| 2014/0253116 A1 | 9/2014 | Freedman et al. |
| 2014/0320126 A1 | 10/2014 | Heaton et al. |
| 2015/0066464 A1* | 3/2015 | Altman .............. G01V 99/005 703/10 |
| 2016/0169820 A1 | 6/2016 | Yang et al. |
| 2016/0290942 A1 | 10/2016 | Wang et al. |
| 2017/0285215 A1* | 10/2017 | Wang .................. G01R 33/46 |

FOREIGN PATENT DOCUMENTS

| | | |
|---|---|---|
| EP | 2584381 A1 | 4/2013 |
| GB | 2489005 A | 9/2012 |
| JP | H03167291 A | 7/1991 |
| WO | 1999/045234 | 9/1999 |
| WO | 2001/042817 A1 | 6/2001 |
| WO | 2007/106810 A2 | 9/2007 |
| WO | 2008/082325 A2 | 7/2008 |
| WO | 2011/014456 A1 | 2/2011 |
| WO | 2011/133859 A1 | 10/2011 |
| WO | 2012/068219 A2 | 5/2012 |
| WO | 2013/023011 A2 | 2/2013 |
| WO | 2013/148516 A1 | 10/2013 |
| WO | 2013/184404 A1 | 12/2013 |

OTHER PUBLICATIONS

Arns, C.H., et al.; "Multidimensional NMR Inverse Laplace Spectroscopy in Petrophysics"; Petrophysics, vol. 48, No. 5, Oct. 2007, pp. 380-392.

Binder, Kurt; "The Monte Carlo Method in Condensed Matter Physics, Topics in Applied Physics", vol. 71, Springer-Verlag, Berlin, (1992), 28 pages.

Brunger, Axel T., et al.; "New Applications of Simulated Annealing in X-ray Crystallography and Solution NMR"; Structure, (1997), vol. 5, No. 3, pp. 325-336.

Chen, Songhua, et al.; "Estimation of Oil Viscosity with Multiple TE Dual Wait-Time MRIL Logs"; Petrophysics, vol. 41, No. 1, (2000), pp. 33-40.

Dunn, Keh-Jim; "Enhanced Transverse Relaxation in Porous Media Due to Internal Field Gradients"; Journal of Magnetic Resonance, vol. 156, (2002), pp. 171-180.

Dunn, Keh-Jim, et al.; "Interpretation of Restricted Diffusion and Internal Field Gradients in Rock Data"; SPWLA 42$^{nd}$ Annual Logging Symposium, Jun. 2001, pp. 1-12.

(56) References Cited

OTHER PUBLICATIONS

Dunn, Keh-Jim, et al.; "The Inversion of NMR Log Data Sets with Different Measurement Errors"; Journal of Magnetic Resonance, vol. 140, (1999), pp. 153-161.

English, A.E., et al.; "Quantitative Two-Dimensional Time Correlation Relaxometry"; Magnetic Resonance in Medicine, vol. 22, (1991), pp. 425-434.

Freedman, R., et al.; "A New NMR Method of Fluid Characterization in Reservoir Rocks: Experimental Confirmation and Simulation Results"; SPE 63214, (Oct. 2000), pp. 1-15.

Hurlimann, M.D., et al.; "Diffusion-Editing: New NMR Measurement of Saturation and Pore Geometry"; SPWLA 43$^{rd}$ Annual Logging Symposium, Jun. 2002, pp. 1-14.

Hurlimann, M.D., et al.; "Quantitative Measurement of Two-Dimensional Distribution Functions of Diffusion and Relaxation in Grossly Inhomogeneous Fields"; Journal of Magnetic Resonance, vol. 157, (2002), pp. 31-42.

Lee, Jing-Huei, et al.; "Two-Dimensional Inverse Laplace Transform NMR: Altered Relaxation Times Allow Detection of Exchange Correlation"; J. Am. Chem. Soc., (1993), vol. 115, pp. 7761-7764.

Martinez, Gary V., et al.; "Lanosterol and Cholesterol-Induced Variations in Bilayer Elasticity Probed by $^2$H NMR Relaxation"; Langmuir, (2004), vol. 20, pp. 1043-1046.

Miller, Alan, et al.; "A New Method for Estimating $T_2$ Distributions from NMR Measurements"; Magnetic Resonance Imaging, (1998), vol. 16, Nos. 5/6, pp. 617-619.

Mohnke, O., et al.; "Smooth and Block Inversion of Surface NMR Amplitudes and Decay Times Using Simulated Annealing"; Journal of Applied Geophysics, vol. 50, (2002), pp. 163-177.

Ornl, Oak Ridge National Report, http://www.phy.ornl.gov/csep (1991), "Mathematical Optimization," 5 pages.

Ortiz-Aleman, C., et al.; "Inversion of Electrical Capacitance Tomography Data by Simulated Annealing: Application to Real Two-Phase Gas-Oil Flow Imaging"; Flow Measurement and Instrumentation, vol. 16, (2005), pp. 157-162.

Parker, Robert L., et al.; "Assigning Uncertainties in the Inversion of NMR Relaxation Data"; Journal of Magnetic Resonance, vol. 174, (2005), pp. 314-324.

Press, William H et al.; "Numerical Recipes in C"; (1995), Cambridge University Press, Cambridge, pp. 394-397, pp. 444-445.

Salazar, R., et al.; "Simulated Annealing Using Hybrid Monte Carlo"; Journal of Statistical Physics, (1997), vol. 89, No. 5/6, pp. 1047-1060.

Song, Yi-Qiao; "Novel NMR Techniques for Porous Media Research"; Cement and Concrete Research, vol. 37, (2007), pp. 325-328.

Sun, Boqin; "In Situ Fluid Typing and Quantification with 1D and 2D NMR Logging"; Magnetic Resonance Imaging, vol. 25, (2007), pp. 521-524.

Sun, Boqin, et al.; "Methods and Limitations of NMR Data Inversion for Fluid Typing"; Journal of Magnetic Resonance, (2004), vol. 169, pp. 118-128.

Sun, Boqin, et al.; "Probing the Internal Field Gradients of Porous Media"; Physical Review E, vol. 65, pp. 051309-1 through 051309-7.

Venkataramanan, Lalitha, et al.; "Solving Fredholm Integrals of the First Kind with Tensor Product Structure in 2 and 2.5 Dimensions"; IEEE Transactions on Signal Processing, vol. 50, No. 5, (May 2002), pp. 1017-1026.

Nojabaei, B., et al.; "Effect of Capillary Pressure on Phase Behavior in Tight Rocks and Shales"; SPE Reservoir Evaluation & Engineering, Aug. 2013, pp. 281-289.

Pang, Jianyuan, et al.; "Effect of Porous Media on Saturation Pressures of Shale Gas and Shale Oil"; IPTC 16419, Mar. 2013, pp. 1-7.

Peterson, Ronald W., et al.; "Self Contained High Pressure Cell, Apparatus and Procedure for the Preparation of Encapsulated Proteins Dissolved in Low Viscosity Fluids for NMR Spectroscopy"; NIH Public Access, Author Manuscript, Rev. Sci. Instrum., Sep. 2005, vol. 76, No. 9, pp. 1-7.

Sigmund, P.M., et al.; "Retrograde Condensation in Porous Media"; SPE 3476, (1973), American Institute of Mining, Metallurgical, and Petroleum Engineers, Inc., pp. 93-104.

Song, Y.-Q, et al.; "$T_1$-$T_2$ Correlation Spectra Obtained Using a Fast Two-Dimensional Laplace Inversion"; 2008, Journal of Magnetic Resonance, vol. 154, pp. 261-268.

Sun, Boqin, et al.; A Global Inversion Method for Multi-Dimensional NMR Logging; Journal of Magnetic Resonance, vol. 172, (2005), pp. 152-160.

Sun, Boqin, et al.; "Core Analysis with Two-Dimensional NMR"; SCA2002-38, pp. 1-12, (year not provided).

Sun, Boqin, et al.; "NMR Inversion Methods for Fluid Typing"; SPWLA 44$^{th}$ Annual Logging Symposium, Jun. 2003, pp. 1-12.

Sun, Boqin, et al.; "NMR Isotherm Studies of Gas Shales"; SPWLA 57$^{th}$ Annual Logging Symposium, Jun. 2016, pp. 1-14.

Sun, Boqin, et al.; "Using NMR to Characterize Fluids in Tight Rock Unconventional and Shale Formations"; SPWLA 57$^{th}$ Annual Logging Symposium, Jun. 2016, pp. 1-14.

Wang, Haijing, et al.; "An NMR Experimental Study and Model Validation on Capillary Condensation of Hydrocarbons Confined in Shale Gas Condensate Reservoirs"; SPE 181652-MS, Sep. 2016, pp. 1-20.

Wang, Hai-Jing, et al; "Critical Role of Water in the Binding of Volatile Anesthetics to Proteins"; J. Phys. Chem. B., Oct. 2013, vol. 117, No. 40, pp. 12007-12012.

Wang, Hai-Jing, et al; "High-Field Nuclear Magnetic Resonance Observation of Gas Shale Fracturing by Methane Gas"; 2014, Energy & Fuels, vol. 28, pp. 3638-3644.

Wang, Hai-Jing, et al; "Water Absorption in Nanoporous Carbon Characterized by in Situ NMR: Measurements of Pore Size and Pore Size Distribution"; 2014, J. Phys. Chem., vol. 118, pp. 8474-8480.

Zhang, Yijia, et al.; "Critical Evaluation of Equations of State for Multicomponent Hydrocarbon Fluids in Organic Rich Shale Reservoirs"; SPE 168812 / URTeC 1581765, Aug. 2013, pp. 1-10.

Anderson, Robert J., et al.; "NMR Methods for Characterizing the Pore Structures and Hydrogen Storage Properties of Microporous Carbons"; JACKS Articles, American Chemical Society, 2010, vol. 132, pp. 8618-8626.

Civan, Frank, et al.; "Impact of Fluid Behavior Modification Under Elevated Pressure and Temperature Conditions on Shale-Gas/Condensate Reservoir Engineering and Production Analysis"; SPE 167186, Nov. 2013, pp. 1-19.

Gelb, Lev D., et al.; "Phase Separation in Confined Systems"; Rep. Prog. Phys., vol. 62, 1999, pp. 1573-1659.

Honapour, M.M., et al.; "Characterization of Critical Fluid, Rock, and Rock-Fluid Properties-Impact on Reservoir Performance of Liquid-rich Shales"; SPE 158042, Oct. 2012, pp. 1-22.

Kausik, Ravinath, et al.; "Characterization of Gas Dynamics in Kerogen Nanopores by NMR"; SPE 147198, Oct.-Nov. 2011, pp. 1-16.

Loucks, Robert G., et al.; "Spectrum of Pore Types and Networks in Mudrocks and a Descriptive Classification for Matrix-related Mudrock Pores"; AAPG Bulletin, vol. 96, No. 6, Jun. 2012, pp. 1071-1098.

Mitchell, J., et al.; "Nuclear Magnetic Resonance Cryoporometry"; Physics Reports, 2008, vol. 461, pp. 1-36.

Musharfi, Nedhal, et al.; "Combining Wireline Geochemical, NMR, and Dielectric Data for Formation Evaluation and Characterization of Shale Reservoirs"; SPWLA 53$^{rd}$ Annual Logging Symposium, Jun. 2012, SPWLA-D-11-00074, pp. 1-16.

Oak Ridge National Report (ORNL), http://www.phy.ornl.gov/csep (1991), "Mathematical Optimization," 5 pages.

Godefroy, S., et al.; "Temperature Effect on NMR Surface Relaxation in Rocks for Well Logging Application"; J. Phys. Chem. B (2002), vol. 106, pp. 11183-11190.

Han, Hui, et al.; "High Pressure Magnetic Resonance Imaging with Metallic Vessels"; Journal of Magnetic Resonance, (2011), vol. 213, pp. 90-97.

Mitchell, J., et al.; "Magnetic Resonance Imaging in Laboratory Petrophysical Core Analysis"; Physics Reports, (2003), vol. 526, pp. 165-225.

International Search Report, dated Oct. 9, 2014, during the prosecution of International Application No. PCT/US2014/036600.

(56) References Cited

OTHER PUBLICATIONS

Written Opinion of the International Searching Authority, dated Oct. 9, 2014, during the prosecution of International Application No. PCT/US2014/036600.

* cited by examiner

Fig. 8: Comparison between the newly measured phase boundary [803] of pore fluids from the acquired NMR signal, and the simulated phase boundary [802] of bulk fluids based on a theoretical model.

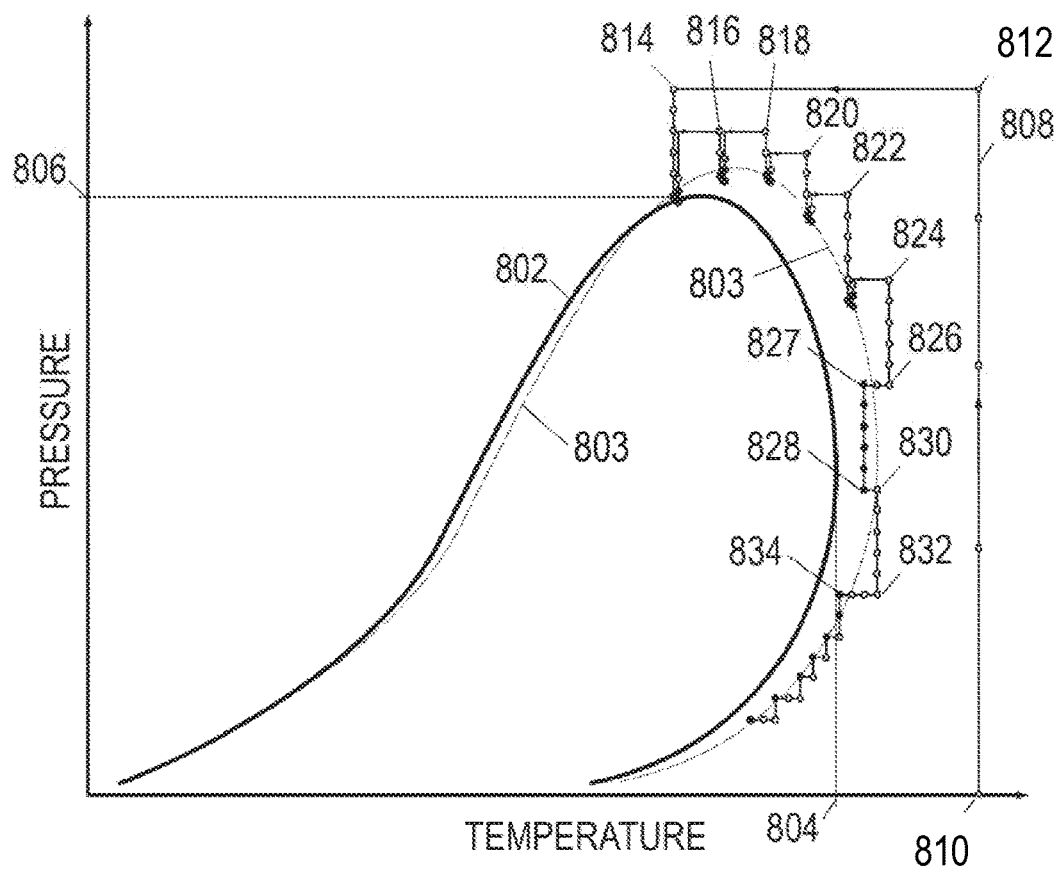

802: Simulated phase boundary of bulk fluids without measurement
803: Newly measured phase boundary of pore fluids
804: Bulk fluid cricondentherm
806: Bulk fluid cricondenbar
808: Pressure-temperature measurement path
810-834: Pressure-temperature measurement points

NMR MEASURED PORE FLUID PHASE BEHAVIOR MEASUREMENTS

CROSS-REFERENCE TO RELATED APPLICATIONS

The present application claims priority to U.S. Provisional Application 62/314,802, titled "Determining Characteristics of a Fluid" by inventors Haijing Wang, Boqin Sun, Scott J. Seltzer, John S. Zintsmaster, and Hussein Alboudwarej, and filed Mar. 29, 2016. This reference is hereby incorporated herein in its entirety.

BACKGROUND

Hydrocarbons have many valuable uses, including fuels for transportation and feedstocks for industrial processes. Hydrocarbons can be obtained via the processes of reservoir characterization, management, and production (including enhanced oil recovery). These processes depend on engineers' understanding of, or assumptions about, the phase behavior of the reservoir fluids. If the phase behavior is not properly understood, reservoir production strategies will not work as intended. For example, excess fluids may suppress desired gas flows, or inadequate gas expansion may be unable to drive desired fluid flows. Conversely, proper understanding of the phase behaviors enables reservoir fluids to be manipulated for optimum production volumes, rates, and/or efficiency.

The current standard for characterizing the phase behavior of reservoir fluids is pressure/volume/temperature (PVT) measurement. PVT measurement is conducted in bulk pressure cells and thus only bulk fluid PVT data are available. However, this conventional PVT technique may not be applicable for unconventional resources, such as nano-confined liquid- or gas-rich shale systems.

Shale reservoirs have demonstrated great potential to supply the world's energy needs in the future. It remains challenging to evaluate the shale reservoir rock, partially due to the abundant ultra-narrow pores on nanometer scale and complex mineralogy. See Musharfi, N., Almarzooq, A., Eid, M., Mahmoud, J., Mahmoud, J., Buller, D., et al. (2012), Combining Wireline Geochemical, NMR, And Dielectric Data For Formation Evaluation And Characterization of Shale Reservoirs, SPWLA 53rd Annual Logging Symposium, 16-20 June, Cartagena, Colombia, SPWLA-2012-074. In addition to common minerals, a significant amount of organic matter is found in intraparticle pores. See Loucks, R. G., Reed, R. M., Ruppel, S. C., & Hammes, U. (2012), Spectrum of pore types and networks in mudrocks and a descriptive classification for matrix-related mudrock pores, AAPG Bulletin, 96, 1071-1098. Nanoscopic pores develop within organic matter during the thermal maturation process. Such organic nanopores may induce large capillary pressures and influence the phase behavior of the hydrocarbon fluids due to the nanoscopic confinement effect. See Gelb, L. D., Gubbins, K. E., Radhakrishnan, R., & Sliwinska-Bartkowiak, M. (1999), Phase separation in confined systems, Reports on Progress in Physics, 62, 1573. Nanoconfined fluids have depression of the bubble point pressure, resulting in lesser volume of gas liberation at any given pressure below the observed saturation pressure. See Honarpour, M. M., Nagarajan, N. R., Orangi, A., Arasteh, F., & Yao, Z. (2012), Characterization of Critical Fluid, Rock, and Rock-Fluid Properties-Impact on Reservoir Performance of Liquid-rich Shales, SPE Annual Technical Conference and Exhibition, (p. SPE 158042), San Antonio, Tex., USA. For gas condensate systems on the other hand, there are conflicting observations with regard to depression or elevation of dew point pressure point in small confined spaces. Compare Civan, F., Michel, G., & Sigal, R. (2013), Impact of Fluid Behavior Modification under Elevated Pressure and Temperature Conditions on Shale-Gas/Condensate Reservoir Engineering and Production Analysis, SPE Unconventional Resources Conference-Canada, (p. SPE 167186), Calgary, Alberta, Canada; and Nojabaei, B., Johns, R. T., & Chu, L. (2013), Effect of Capillary Pressure on Phase Behavior in Tight Rocks and Shales, SPE Reservoir Evaluation & Engineering, SPE-159258-PA.

Conventional PVT measurement is in the bulk phase, and is thus unable to probe the true phase behavior and fluid composition inside the shale nanopores. Previous groups have attempted numerical simulations to assess the phase behavior of hydrocarbon fluids in shale nanopores. However, the equation of state for these nanoconfined systems remains an issue of controversy. See Zhang, Y., Civan, F., Devegowda, D., Jamili, A., & Sigal, R. F. (2013), Critical Evaluation of Equations of State for Multicomponent Hydrocarbon Fluids in Organic Rich Shale Reservoirs, Unconventional Resources Technology Conference, (p. SPE 168812/URTeC 1581765), Denver, Colo., USA. No consensus has been reached on how the phase behavior responds to the nanoscopic confinement. See Pang, J., Zuo, J., Zhang, D., & Du, L. (2013), Effect of Porous Media on Saturation Pressure of Shale Gas and Shale Oil, International Petroleum Technology Conference, (p. IPTC 16419). Beijing, China. There has been no lab characterization method available to directly assess the phase behavior of reservoir fluids in shale reservoir rocks with microscopic details. This deficiency can significantly impact estimation of hydrocarbon storage and recoverability.

SUMMARY

Accordingly, there are disclosed herein systems and methods for characterizing the phase behavior of fluids in a porous medium such as a tight gas shale. One illustrative system embodiment for measuring phase behavior of a pore fluid includes: a sample cell that receives a porous medium for exposure to a fluid; a pressure control system that supplies the fluid to the sample cell with a controllable fluid pressure; a temperature control system that controls a fluid temperature of the fluid in the sample cell; a nuclear magnetic resonance (NMR) probe that collects NMR signal measurements from nuclei of the fluid and porous medium in the sample cell; and a computer that derives, from the NMR signal measurements, the distribution of one or more NMR parameters as a function of fluid pressure and fluid temperature along a pressure-temperature path that crosses a phase boundary, said crossing being detected as a change in the distribution.

One illustrative method embodiment for measuring the phase behavior of a pore fluid includes: (a) loading a fluid into a nuclear magnetic resonance (NMR) sample cell containing a porous medium; (b) setting a pressure and a temperature for the fluid in the NMR sample cell; (c) applying a radio-frequency (RF) pulse sequence to the fluid and porous medium in the NMR sample cell to acquire a NMR signal at the pressure and the temperature; (d) deriving a distribution of one or more NMR parameters that depends on the pressure and the temperature; (e) determining whether a fluid phase is present based on the distribution; (f) varying the pressure, the temperature, or any combination thereof and repeating operations (c) through (f) to determine the presence or absence of the fluid phase at multiple points along a pressure-temperature path that crosses a phase boundary; and (g) providing an estimated location of the phase boundary based on the presence or absence of the fluid phase at said points.

Other aspects of the foregoing embodiments which may be incorporated individually or in any suitable combination include: (1) the derived NMR parameter distribution is a distribution over chemical shift (i.e., an NMR spectrum), or a distribution over spin-lattice relaxation time (T1), spin-lattice relaxation time in rotating frame (T1ρ), spin-spin relaxation time (T2), diffusion coefficient ($D_S$), or any combination thereof for one or more nuclei types in a set consisting of 1H, 2H, 3H, 13C, 14N, 15N, 17O, 19F, 33S, 129Xe. (2) said change is to a peak width in the NMR parameter distribution. (3) the NMR parameter distribution is 1H chemical shift. (4) the computer compares the peak width to a threshold, and wherein a width below the threshold indicates an absence of a liquid phase. (5) the porous medium is a plug or powder from a subterranean formation. (6) the porous medium is shale. (7) the fluid is a reservoir fluid sampled from a subterranean formation. (8) the fluid is a mixture including one or more hydrocarbon components. (9) the phase boundary is part of a phase envelope around a pressure-temperature region having multiple fluid phases. (10) the path crosses the phase boundary along an isotherm from a single-phase region. (11) the path crosses the phase boundary along multiple isotherms. (12) at least part of the path alternately crosses the phase boundary along isobars and isotherms, the computer detecting each crossing. (13) displaying at least a portion of a phase envelope delineating a single phase region from a multiple phase region of a pressure-temperature phase diagram. (14) the path re-crosses the phase boundary along said at least one isotherm from a multiple phase region to improve location accuracy. (15) one or more gradient magnets to shift a measurement point of the NMR probe within the sample cell. (16) the computer derives the NMR parameter distributions as a function of position to characterize inhomogeneity of the porous medium.

BRIEF DESCRIPTION OF THE DRAWINGS

In the drawing figures:

FIG. 8 is a pressure-temperature graph showing an illustrative mapping strategy.

Figure 1:
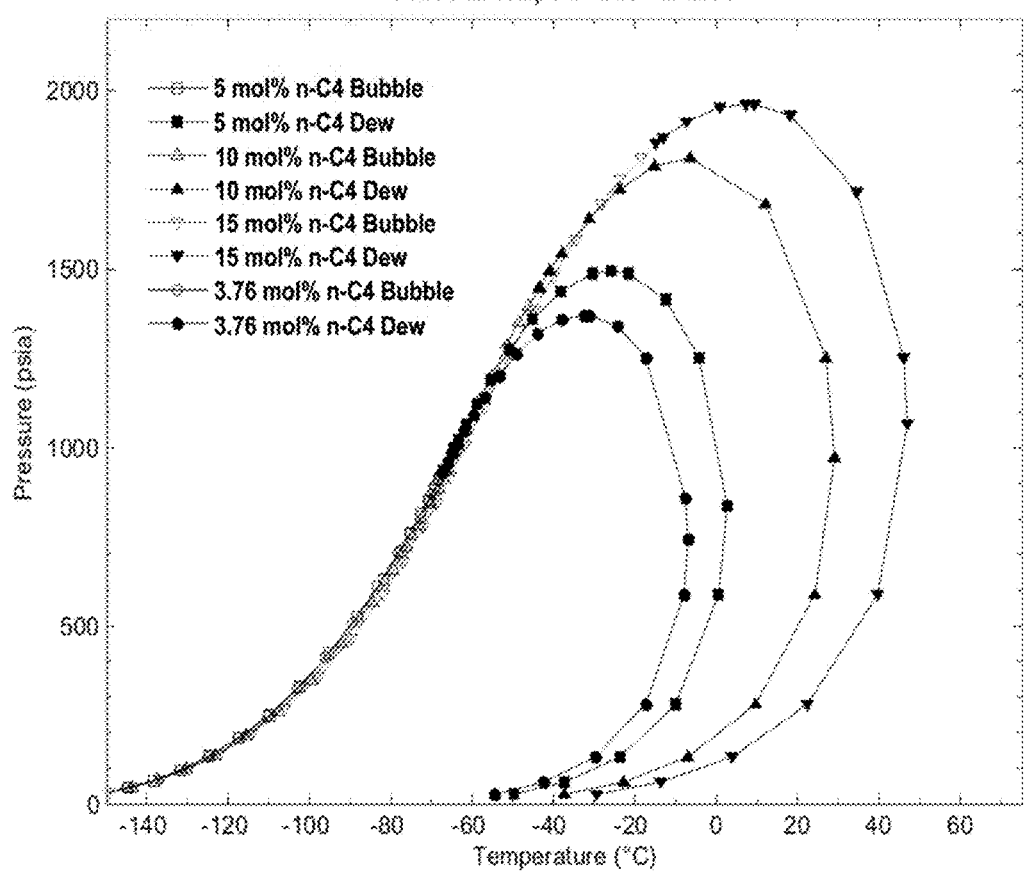
FIG. 1 is a graph of an illustrative set of pressure-temperature phase envelopes.

It should be understood, however, that the specific embodiments given in the drawings and detailed description do not limit the disclosure. On the contrary, they provide the foundation for one of ordinary skill to discern the alternative forms, equivalents, and modifications that are encompassed in the scope of the appended claims.

DETAILED DESCRIPTION

Nuclear magnetic resonance (NMR) and/or magnetic resonance imaging (MRI) are versatile technologies that have been widely used in medical imaging, analytical chemistry, and non-intrusive characterization. They are capable of probing molecules inside opaque porous media and revealing microscopic characteristics of molecular dynamics and phase behavior. See, e.g., Slichter, C. (1990), Principles of Magnetic Resonance (3rd ed.), Berlin: Springer-Verlag; and Abragam, A. (1983), Principles of Nuclear Magnetism, New York: Oxford University Press. If equipped with apparatus for injecting hydrocarbon fluids and controlling pressure and temperature, an NMR system can be used as described below to measure the phase behavior of reservoir fluids, both in bulk fluid and confined inside nanopores. The composition of the injected hydrocarbon fluids can be chosen to represent the reservoir fluids in formations of interest.

In a strong, uniform magnetic field, a sequence of radio frequency (RF) pulses is applied to the sample region, producing a series of echo signals whose amplitude is measured as a function of the inter-pulse timing in the RF pulse sequence. The RF signal frequency depends on the strength of the static field and the type of nucleus to be excited, but may generally be expected to be within the range from about 2 MHz to about 1 GHz. Depending on the particular RF pulse types in the sequence, the echo amplitude exhibits a decay rate that depends on one or more relaxation time constants of the nuclei responding to the pulse excitations. If a transform, such as a Laplace transform, is applied to the amplitude decay curve, the result is a distribution indicating the energy density or normalized concentration of nuclei as a function of the selected time constant. Similarly, other NMR parameter distributions, such as chemical shift and self-diffusion coefficient, can be derived in accordance with techniques from the relevant literature.

The derived NMR parameter distributions will vary for different hydrocarbons (methane, ethane, propane, butane, etc.) in different phases (adsorbed/confined, liquid/gas) and different environments (pore size, surface chemistry), enabling these distributions to serve as "NMR signatures" with the distribution peaks having unique combinations of position, amplitude, width, and shape (e.g., Gaussian, Lorentzian, or a combination thereof). The composition and phase of the fluids in the sample can be determined by finding the linear combination of these unique signatures which best matches the measured distribution. The NMR parameter distributions that are particularly sensitive to molecular dynamics and the interaction between molecules and their local environment include: the spin-lattice relaxation time (T1), the spin-spin relaxation time (T2), T1 in the rotating frame (T1ρ), the self-diffusion coefficient ($D_S$), and the chemical shift (relative change in the resonance frequency of the nucleus). (References herein to T2 also contemplate the inhomogeneous spin-spin relaxation time constant T2*.) Nevertheless, other NMR parameter distributions are also useful for distinguishing between phases, and the analysis need not be limited to only one NMR parameter. A multi-dimensional distribution reveals the distribution of signal energy or responsive nuclei as a function of multiple NMR parameters, enabling different phases to be more robustly distinguished.

Laplace inversion algorithms may be used to process adsorption and NMR data to obtain a multi-dimensional distribution of adsorption and NMR relaxation parameters, which contain the key information regarding the microporosity and gas storage mechanism for even a single-component fluid. Multi-component hydrocarbons bring even more dimensions into consideration, i.e. a broad range of hydrocarbon compositions with a correspondingly broad range of surface interaction and liquid/gas properties, for the characterization of gas shale reservoirs. Any applicable NMR/MRI acquisition techniques can be used to collect the relevant measurements for reservoir fluids in porous medium as a function of pressure and temperature. For example, NMR signals stimulated by a single RF pulse corresponding to spin flipping angle of π/2, also known as Free-Induction-Decay (FID), can be Fourier-transformed and processed into a one-dimensional chemical shift distribution. Other pulse sequences, including single pulses corresponding to any flip angle, multiple pulses for spin echo, saturation recovery, inversion recovery, spin-locking, as well as the standard Carr-Purcell-Meiboom-Gill (CPMG), may be used alone or in combination. Moreover, multi-dimensional sequences such as those employed for 2D correlation spectroscopy (COSY), 2D exchange spectroscopy (EXSY), 2D spin-diffusion, 2D Nuclear Overhauser spectroscopy (NOSY), and combinations thereof, may be employed. The pulse sequences may be designed to excite one type of nucleus, or multiple types (e.g., for measuring cross-polarization and polarization transfer). Candidate nuclei types include 1H, 2H, 3H, 13C, 14N, 15N, 17O, 19F, 33S, 129Xe.

The central frequency ("position") and linewidth of the NMR spectrum peaks can be used to differentiate molecules in different phases, molecular dynamics, and local environment. The integrated area under each NMR spectrum peak is proportional to the number of nuclei within the detection region. As long as the NMR signal is carefully calibrated against a known number of nuclei, the NMR signal intensity can be converted into number of detected molecules, assuming the same excitation and detection conditions. In at least some contemplated embodiments, we use an otherwise empty high-pressure NMR sample cell of known volume filled with a known pressure of CH4 as the NMR signal calibration standard.

A number of pulse sequences can be used to obtain the distributions of spin-lattice relaxation time (T1), spin-lattice relaxation time in the rotating frame (T1ρ), and spin-spin relaxation time (T2). T1 is sensitive to the molecular exchange between surface adsorbed and pore space confined molecules. The adsorbed molecules have shorter T1 because of the restricted motion on the surface. The T1 of confined molecules is a weighted average of T1 of free and adsorbed molecules depending on the rate of exchange between two phases. T2 is sensitive to the translational motion of molecules and local magnetic field gradient. T1 and T2 provide additional dimensions in NMR spectroscopy for accurate quantification of molecules within the detection region, and for precise differentiation of molecular composition in different phases, molecular dynamics, and local environment. The RF pulse sequences may be designed to excite 1H, 13C, or other labeling NMR active isotopes. Advanced NMR techniques such as cross polarization of 13C can be used to enhance sensitivity. Quadrapolar NMR spectra can be taken on 2H-containing hydrocarbon substitution. Further, multi-dimensional NMR techniques such as 2D correlation spectroscopy (COSY), 2D exchange spectroscopy (EXSY), and 2D spin-diffusion, can provide more information about molecular dynamics and phase behavior that are too complex for determination with only one-dimensional RF pulse sequences. Cross-peak patterns in multi-dimensional NMR parameter distributions provide in-depth details on how molecules are interacting with each other (a useful indicator of phase behavior) and with different sites and pore space (through which nanoconfinement impacts on the phase behavior can be measured).

These features make NMR measurements capable of, and suitable for, probing the phase behavior of reservoir fluids in porous media, in order to understand the effect of shale nanopores on the phase behavior of reservoir fluids. While the discussion below focuses on liquid-gas phase behavior of reservoir fluids, the disclosed method and principles can also be used to map the phase envelope of asphaltene precipitation, gas hydrates, and other fluid systems. The disclosed method includes loading appropriate fluids into a high-pressure NMR sample cell (with or without porous samples including reservoir rocks), controlling the pressure and temperature of the system to navigate through the phase space, using a radio-frequency (RF) resonator to stimulate and collect NMR signal measurements from fluids within the NMR sample cell at each pressure and temperature condition, deriving and analyzing NMR parameter distributions to obtain phase behavior, compositional information, and local environment, and constructing the entire phase envelope if necessary.

Phase behavior can be represented in a variety of ways, including the pressure-temperature phase envelope as shown in FIG. 1. Envelopes are shown for four two-component mixtures of methane (CH4) and butane (C4H10, also known as n-C4) with the concentration of butane ranging from 3.76% (molar concentration) to 15 mol %. Each envelope is formed by a bubble-point curve (open shapes) and a dew-point curve (filled shapes), which meet at a critical point. Above the bubble-point curve, the mixture is a single-phase liquid. Above and to the right of the dew-point curve, the mixture is a single-phase gas. Inside the envelope, the mixture includes both a liquid and a gas phase, with compositions that change for different pressures and temperatures.

Figure 2:
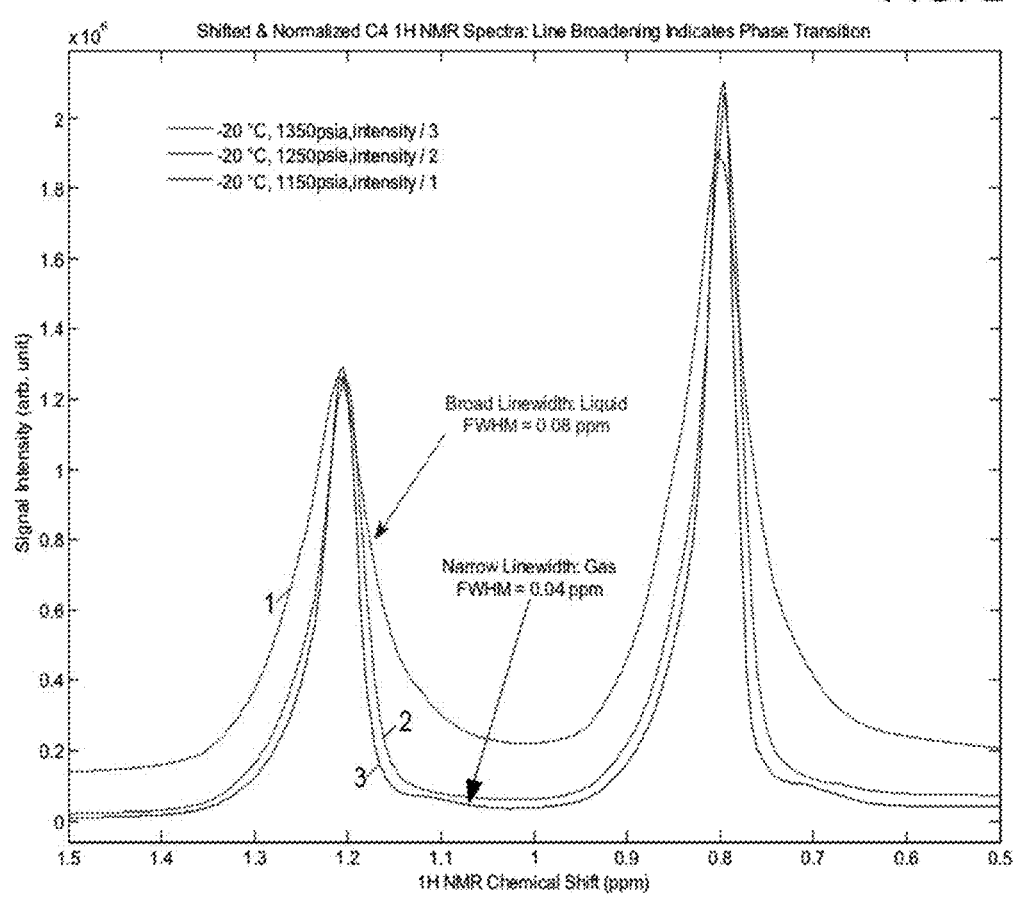
FIG. 2 is a graph of an illustrative set of NMR chemical shift spectra at different pressures.

As but one possible indicator of phase concentrations, FIG. 2 shows the NMR spectra for the hydrogen nuclei in bulk n-C4 at −20° C. for three gradually decreasing pressures 1350 psia (curve 3), 1250 psia (curve 2), and 1150 (curve 1), yielding a peak width (full width at half-maximum) that varies from 0.04 ppm for the pure gas phase to 0.08 ppm for the liquid phase. The broadening (to 0.05 ppm) starts around 1250 psia, suggesting liquid drop out onto the surface of sample cell, since liquid spends longer time on the solid surface and possesses shorter T2 and broader linewidth. Consequently, a T2 parameter distribution would be expected to have one or more peak positions shift to lower T2 values for the liquid phase. Such peak shifts would also be expected for T1, T1rho, and the diffusion coefficient. While any combination of the foregoing parameters could be used to detect the phase transistion, the chemical shift linewidth was found to provide sufficient sensitivity. In any event, this condensation point agrees well with the phase envelope calculated by an internal phase calculation program, providing additional confirmation that NMR-determined molecular composition is accurate and NMR parameter distributons are sensitive to the phase transition of bulk gas mixtures. In this example, a peak width in excess of 0.045 ppm may be taken as indicating the presence of a liquid n-C4 phase. Although the internal phase calculation program is mentioned herein, commercially available tools, such as Aspen HYSYS™ and the like, may be used as alternatives.

The envelopes shown in FIG. 1 are calculated by the internal phase calculation program, which employs a model for phase behavior of the bulk mixture. Note that the composition affects the position of the phase envelope. As discussed previously, the phase envelope position is also expected to vary based on the size and surface chemistry of pores in the reservoir formation. Yet unlike bulk mixtures, such phases cannot be directly observed, since they reside in a solid matrix. The system of FIG. 3 is provided to enable the determination of phase behavior in porous media.

Figure 3:
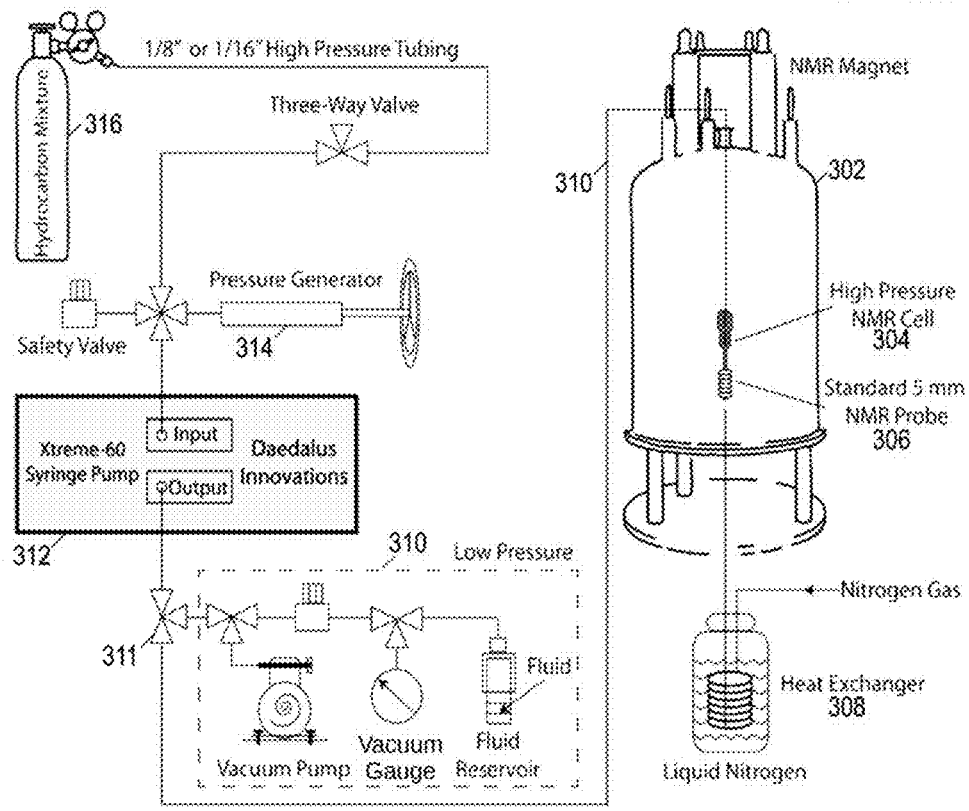
FIG. 3 is a schematic of an illustrative system for measuring phase behavior in porous media.

FIG. 3 shows an experimental NMR system equipped with a system for in-situ fluid loading. The illustrated system includes an NMR or MRI spectrometer, shown here as a vacuum chamber 302 containing a superconducting magnet at liquid helium temperature for providing a strong, internal magnetic field. Inside the chamber 302, a high-pressure NMR sample cell 304 holds a fluid sample (with or without the porous media) inside a 5 mm standard NMR probe 306. A temperature control system circulates a fluid, such as dry nitrogen gas from heat exchanger 308 inside a dewar of liquid nitrogen, to the NMR probe to establish and maintain the fluid sample at a selectable temperature below ambient. The temperature control system may further include heating coils built in to the chamber 302 and sample cell 304 to establish and maintain the fluid sample at a selectable temperature above ambient. The cooling and heating systems may be employed together, adjusting the nitrogen gas flow rate and heating coil current to achieve precise temperature control. Temperature ranges from minus 200° C. to over +250° C. are contemplated.

The high-pressure NMR sample cell 304 can be filled with a gas shale sample or other porous media before being inserted into the chamber 302. A flow line 310 couples the sample cell 304 to a low pressure (vacuum) component 310 and, via an optional pump 312, to a high pressure generator 314. The high pressure generator 316 draws from a source 316 of the reservoir fluid or other sufficiently representative fluid, presumably a multi-component hydrocarbon. The fluid source 316 holds the reservoir fluids of desired composition ready for loading into the NMR sample cell 304. The fluid source 316 may be one or multiple gas cylinders connected to the high pressure generator 314. Pure single-component hydrocarbon gas, such as methane, or pre-mixed hydrocarbon mixture gas with the composition of choice, can be purchased from vendors, or mixed in-house, and stored in the gas cylinder(s). Further mixing of hydrocarbon components can be achieved in a manifold and brought into the high pressure NMR sample cell through transfer lines 310.

The high pressure generator 314 may include multiple stages of pressure boosting pumps (e.g., syringe pump 312) coupled to each other and the NMR sample cell 304 using high pressure transfer lines 310. The pressure of the hydrocarbon mixture can be controlled by regulator and pressure booster. Pressures up to 5000 psia or, in some cases up to 60,000 psia, are contemplated.

A three-way valve 311 is inserted into the high-pressure lines to introduce an open port for the low pressure component 310, including a vacuum pump, pressure gauge, and a vessel to contain water or volatile hydrocarbons. The NMR sample cell 304, after being loaded with porous media and inserted into chamber 302, is evacuated to remove air. All liquid is degassed in the system before use to remove any dissolved gas impurities in the liquid. This provides an extra flexibility and capability on controlling the composition of hydrocarbon mixtures.

The sample cell is then exposed to the hydrocarbon mixtures of the desired pressure supplied by the transfer lines 310. Hydrocarbon fluids contain 1H and 13C, which carry nuclear spin-1/2 and can be detected by 1H and 13C NMR, respectively. Hydrocarbons with isotopically enriched 13C can be used to enhance the sensitivity since the natural abundance of 13C is ~1.1 mol %. If necessary, we can use hydrocarbons with partial or complete 1H substituted by 2H for quadrapolar NMR spectroscopy. Similar isotope substitution can be used for any NMR active nuclei. The chemical properties will remain very similar with isotope substitution. Alternatively, small amount of impurities such as 129Xe can be added to the fluids system to provide extra sensitivity on phase behavior as it will have different NMR signatures that will be distributed differently in liquid and gas phase.

Thereafter, the pressure and temperature of the fluid in the sample cell 304 is controlled to enable navigation through phase space. In early experiments, we chose a hydrocarbon mixture of 95 mol % CH4 and 5 mol % n-C4 to ensure the dew point line is not crossed while increasing pressure at the ambient temperature. Other contemplated fluids include fluid sampled from subterranean formations of interest, synthetic reproductions thereof, asphaltene precursors, gas hydrate components, and combinations thereof.

A computer may be coupled to the system of FIG. 3 via electronic instrumentation that enables the computer to monitor the state of the system via data acquisition and via electronic actuators to control or adjust that state. The computer may control the valves and pumps to evacuate and refill the sample cell 304 with the desired fluids at a desired, adjustable pressure, may control the heating and cooling systems to set and adjust the temperature. The computer may be coupled to pressure and temperature transducers for pressure and temperature monitoring and regulation. The computer may further be coupled to the NMR probe to generate the RF pulse sequences and collect the echo measurements and derive the desired NMR parameter distributions. The computer may execute software that enables an operator to configure and initiate these operations. The software may further configure the computer to navigate the pressure and temperature set point through pressure and temperature space to locate and optionally map a phase envelope boundary while extracting from the NMR parameter distributions the relevant phase behavior measurements as a function of pressure and temperature.

Figure 4:
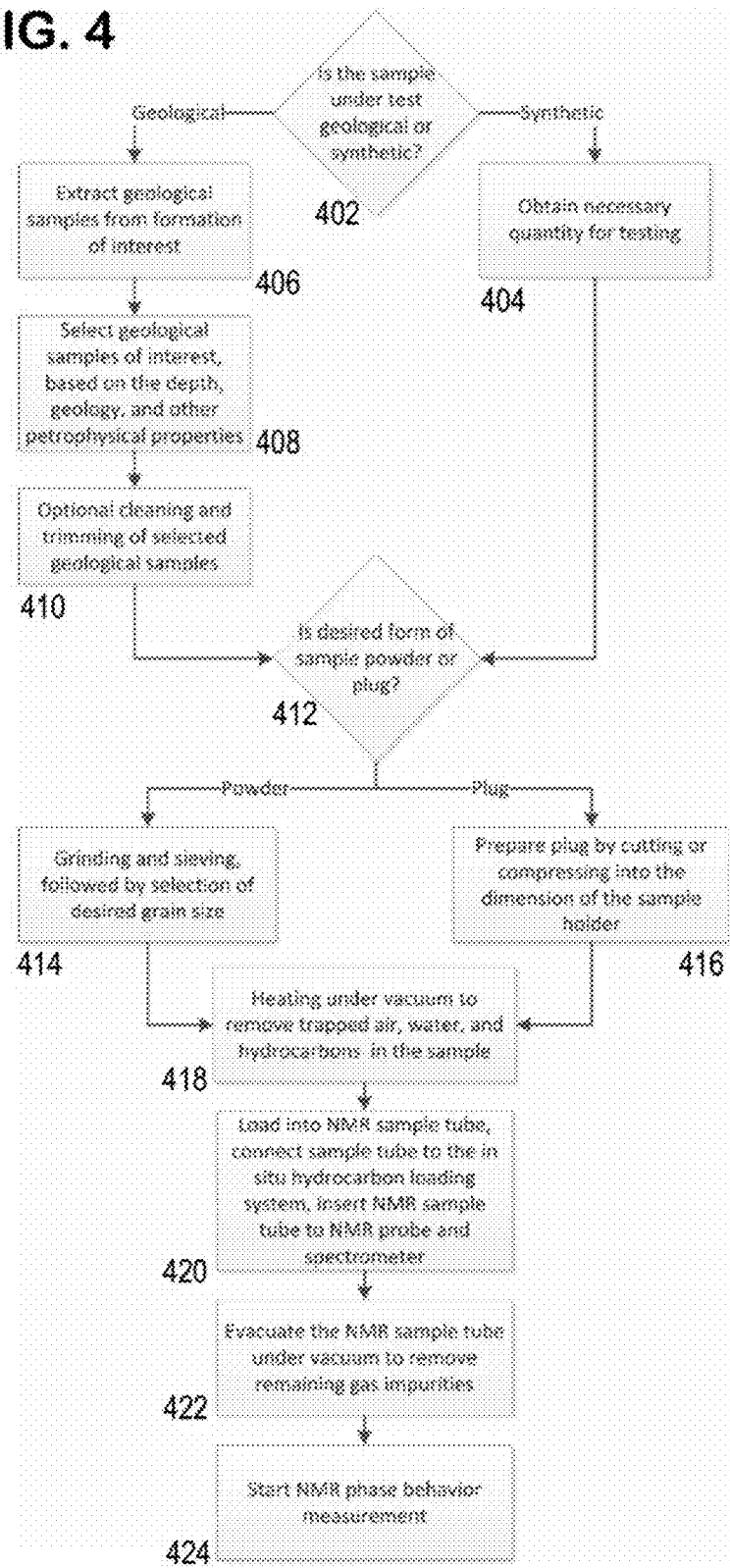
FIG. 4 is a flow diagram of an illustrative porous media preparation and testing method.

The preparation of the porous media sample should account for the dimensions of the sample cell 304, filling as much of the cell volume as practicable. (In some systems, the NMR sample cell has an inner diameter of about 3 mm.) One illustrative porous media preparation method is illustrated in FIG. 4. The method begins in block 402 with a determination of whether a geological formation sample is an option or if a synthetic substitute must be used. In the latter case, the necessary quantity of the synthetic material is obtained in block 404. In the former case, a set of geological samples is obtained from the formation of interest in block 406. In block 408, one or more of the geological samples is chosen based on depth, geology, petrophysical properties, or other indicators of that sample's significance. In block 410, the sample is optionally cleaned, trimmed, and/or dried.

From block 404 or 410, the method progresses to block 412, where a determination is made of whether the porous media is desired in powder or plug form. Powder form may be preferred for minimizing time required for the pore fluids to reach steady state, in which case the sample material is ground, sieved, and separated based on granular size in block 414. In one experiment, we started from a cleaned and dried shale core sample, chipped off small pieces, and ground them into small granules. We used different mesh sizes of sieves to further separate the granules into different granular sizes (250 μm, 425 μm, 850 μm, and 2 mm).

At times, the plug form may be preferred, e.g., for confirming validity of powder-based measurements, in which case a plug is prepared in block 416 to match the internal dimensions of the sample cell 304 by cutting a piece from a larger whole or by compressing a granular material into a unit.

In block 418, the porous media is heated in a vacuum to remove trapped air, water, and hydrocarbons from the sample. In one experiment, the powder granules were placed in vacuum oven set at 60° C. for at least 6 hours to remove any hydration water before being loaded into the NMR sample cell. In block 420, the porous media is place in the NMR sample cell 304, the cell 304 is connected to a fluid loading system via flow line 310 and inserted into the probe 306. Note that once loaded into the NMR sample cell, the mass and volume of the porous media are carefully measured for quantitative determination of fluid properties. In block 422, a vacuum is applied to the cell 304 to remove any remaining gas impurities. In one experiment, the entire fluid loading system and NMR sample cell were vacuum pumped for at least 12 hours before initiating the experiment, to guarantee that there were no other gas impurities, such as oxygen, nitrogen, water, in the system. In block 424, the NMR parameter distribution measurements are performed as a function of pressure and temperature.

Figure 5:
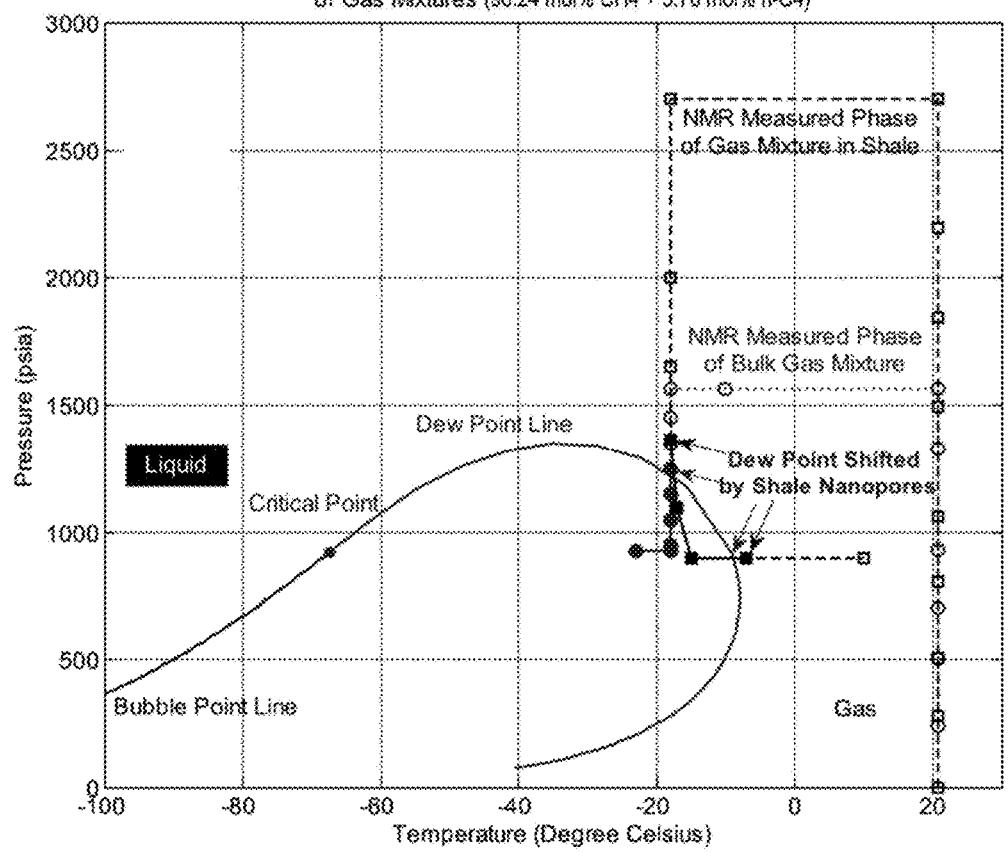
FIG. 5 is a pressure-temperature graph of measurement paths relative to an envelope.

FIG. 5 shows an illustrative envelope calculated for the bulk fluid behavior of a fluid mixture having 96.24 mol % $CH_4$ and 3.76 mol % $n-C_4$. Two pressure-temperature paths are also shown, with measurement points marked by circles (for the bulk fluid "control" experiment) and by squares (for the measurements with shale). A gas shale sample was loaded into the NMR sample cell to examine the impact of nanopores on the phase behavior of hydrocarbon mixtures. The pore size distribution of gas shale sample was characterized by a couple of techniques including light hydrocarbon adsorption and nitrogen gas adsorption. The porosity has significant contribution from pores of 15 nm in diameter. Such a small pore size is expected to induce capillary condensation with a considerable capillary pressure, shifting the phase envelope. The sample was prepared following the procedure illustrated in FIG. 4.

The circle and square markers for the measurement points in FIG. 5 are filled or open to indicate the detection or absence of a liquid phase, respectively. Both paths begin at room temperature and pressure, pass along an isotherm to an elevated pressure (1550 psia for bulk fluid, 2700 psia for shale), pass along an isobar to −18° C., and are directed along an isotherm to encounter the phase envelope from above. The circles along the bulk-phase experiment path change from open to filled as the path crosses the phase envelope, confirming the bulk fluid model. However, the squares along the path for the shale experiment change from open to filled approximately 115 psia above the bulk-phase envelope. The path for the shale experiment is then directed along an 800 psia isobar to escape the phase envelope. At least a degree or two above the expected envelope boundary, the square remains filled, presumably due to the effects of the porous media.

Figure 6:
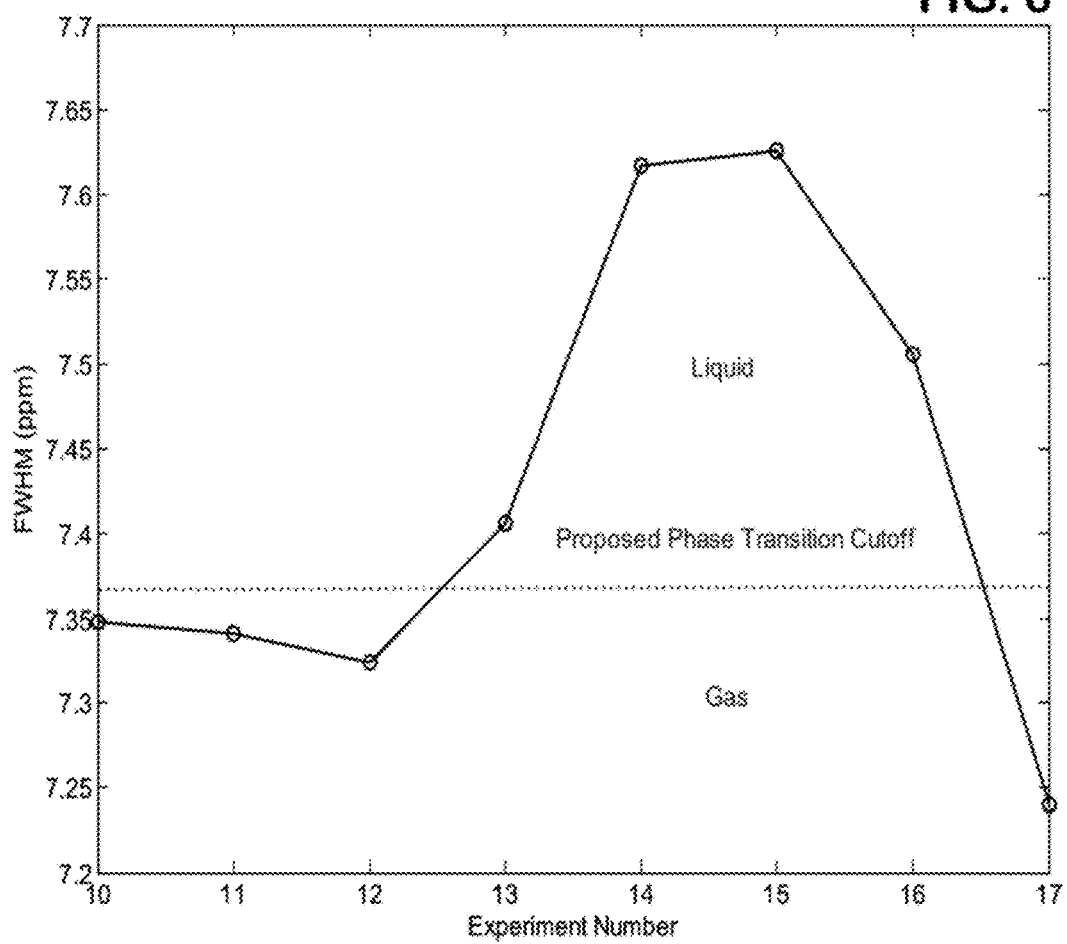
FIG. 6 is a graph of peak width versus test number.

FIG. 6 shows the full width half maximum (FWHM) measurements for a NMR chemical shift peak (see FIG. 2) at each square along the shale experiment path of FIG. 5, taken in order from the starting point. The test ("experiment") numbers 13-16 correspond to the four filled squares in FIG. 5. For this experiment, an FWHM threshold of 7.37 ppm is employed for detecting line broadening indicating the presence of a liquid phase, with lower values taken to indicate the absence of a liquid phase. Higher values indicate liquid drop out because, unless there is such a phase transition, the FWHM should only decrease as we reduce pressure for desorption. Thus the increase in FWHM for tests #13 and #16 is an indication of liquid drop out and they should be enclosed within the phase envelope between upper and lower dew point lines. FIG. 5 reveals the obvious difference between the envelope of control experiment, i.e. bulk hydrocarbon mixtures in an empty sample cell, and the envelope for the experiment with gas shale samples. The latter showed obvious shift of dew point lines by 115 psia increase induced by the capillary effect of shale nanopores.

Figure 7:
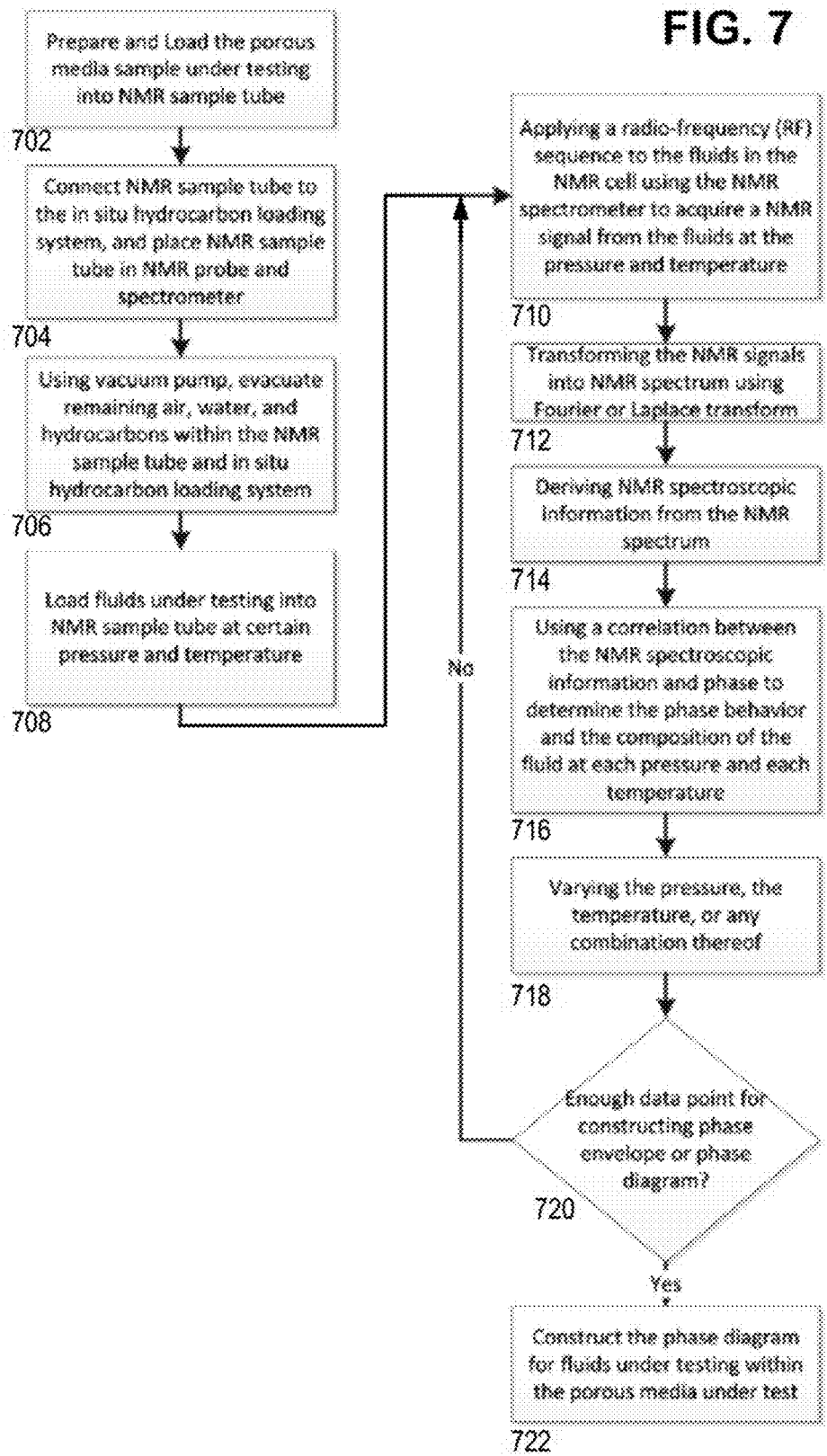
FIG. 7 is a flow diagram of an illustrative method for measuring phase behavior in porous media.

In view of the foregoing disclosure, FIG. 7 presents a method for measuring multi-component fluid phase behavior in porous media such as shale. The method begins in block 702 with the preparation and loading of the porous media sample into the NMR sample cell 304. The preparation may be performed in accordance with blocks 402-418 of FIG. 4. In block 704, the NMR sample tube 304 is connected to the fluid loading system and placed in the NMR probe, in accordance with the discussion of block 420 (FIG. 4). While in the NMR probe, the sample experiences a strong, uniform magnetic field. In block 706, the system evacuates the fluids from the NMR sample cell using a vacuum pump, in accordance with the discussion of block 422 (FIG. 4). In block 708, the system injects the desired fluid mixture into the NMR sample cell 304 and establishes an initial pressure and temperature set point for the sample.

Blocks 710-720 form a loop. In block 710, after a pressure and temperature equilibrium has been established, the system applies a sequence of RF pulses to the sample cell and acquires a full set of NMR signal measurements for that pressure and temperature set point. In block 712, the NMR signal measurements are transformed (e.g., Laplace Transform, Fourier Transform), to obtain a one dimensional or multi-dimensional NMR parameter distribution for that pressure and temperature set point. In block 714, the system analyzes the distribution to measure characteristics indicative of the phase behavior (and optionally the phase composition), e.g., relative amplitude, area, position, width, and shape of selected peaks. While each of these characteristics may be indicative of the presence or absence of a liquid phase, straightforward experimentation may reveal that selected ones of these characteristics are particularly sensitive and robust indicators, and the selected indicators may vary for different nuclei, different fluids, and different matrix materials. In block 716, the system compares the measured characteristics with thresholds or known indicators of phase behavior and composition. Thus, for example, peak widths in excess of a threshold may be taken as indicating the presence of a liquid phase.

In block 718, the system varies the sample cell's pressure, temperature, or a combination thereof to adjust the set point. This transient process may take seconds, hours, or even days, depending on the permeability of the rock sample. Short NMR acquisition sequences are applied continuously during the transitions to monitor the transient process and ensure equilibrium is reached in terms of pressure, temperature, and composition. After, during, or even before starting this adjustment, the system checks in block 720 whether enough information has already been obtained for constructing the desired portion of the phase envelope. If not the loop iterates until this condition is satisfied, at which point the system constructs the phase envelope in block 722 and terminates the experiment after outputting the results for analysis and subsequent use by the operator or other systems performing e.g., reservoir characterization, management, and production.

If further measurements are required, the system repeats the loop from block 710. The NMR signal acquisition and analysis are performed at each equilibrium stage to obtain detailed information on phase behavior. The key advantages of in-situ NMR measurement of phase behavior is that the pressure and temperature can be controlled independently from NMR detection, and the amount of molecules inside pores at each phase point can be quantified in-situ without having to involve volume change, as long as the NMR signal is calibrated. The pressure-temperature path is designed to cross the phase envelope as discussed further below. Any phase change, such as liquid dropout when crossing dew point lines and bubbling when crossing the bubble point lines, are associated with sudden changes in density and molecular dynamics. These changes can be detected through NMR signal recorded at each phase point, including but not limited to changes in the linewidth of the T1, T1$\rho$, and T2 parameter distributions. Those signature changes can be identified as dew point or bubble point indicators. The phase behavior can be constructed by repeating this step for a number of pressure and temperature steps in the pressure-temperature space.

FIG. 8 shows an illustrative phase envelope 802 for a bulk fluid hydrocarbon mixture in pressure-temperature space. Envelope 802 exhibits a bulk fluid cricondentherm 804 and a bulk fluid cricondenbar 806. These values may be taken into consideration when designing a pressure-temperature path 808 for locating and optionally mapping the phase envelope of fluids in porous media. While it is not a requirement, it may be preferred to initiate the measurements with the fluid at a point outside of the phase envelope, as the use of a single phase enables the fluid composition to be accurately controlled during the loading of the sample cell. It may also be preferred to locate the phase envelope boundary along an isotherm from an elevated pressure, as this approach minimizes the influence of residual contaminants (by providing a greater concentration of the injected fluid mixture) and more closely models the expected evolution of conditions in most reservoirs. To reach the elevated pressure, it may further be preferred to avoid crossing the phase envelope, as the phase change may interfere with migration of the mixture into the pores, may unpredictably alter the phase compositions (thereby introducing another factor to modify the phase envelope), and may inhibit the pressure increase as liquid drop out occurs. Yet another preference may be to favor pressure changes over temperature changes, as it may take longer for equilibrium to be established after a temperature change.

With these considerations in mind, coupled with a desire to optimize a trade-off between measurement time and robustness, the pressure-temperature path 808 may be designed as provided in FIG. 8. The sample cell 304 is taken to a starting pressure-temperature point 810 above the cricondentherm 804, with sufficient margin to also be above the as-yet-uncertain cricondentherm of the pore-shifted phase envelope. For calibration, an initial NMR parameter distribution may be measured at this point. An isotherm is followed to an elevated pressure point 812 above the cricondenbar 806, with sufficient margin to also be above the as-yet uncertain cricondenbar of the shifted phase envelope. NMR parameter distributions may be sampled along the isotherm for further calibration and to verify that the path does not unexpectedly cross the phase envelope.

From elevated pressure point 812, the path may follow an isobar to a launch point 814 for the boundary search. Depending on the circumstances, the launch point temperature may be a reservoir temperature, a temperature near the peak of the bulk fluid envelope, or a lowest temperature for a range of interest. Preferably, the launch point temperature is above a critical point where line broadening might potentially be observed in the single gas phase. The path 808 then descends along an isotherm until formation of a liquid phase is detected. In at least some embodiments, the descending pressure steps are relatively coarse, e.g., 400 psia. Upon detecting a liquid phase, an additional reduced pressure reading may be taken to confirm the detection, and the path may begin ascending back along the isotherm in reduced-size steps, e.g., 100 psia, to refine the location of the boundary. Once the liquid phase has disappeared, the path moves to a point 816 on a higher isotherm with a pressure anticipated to be above the envelope, e.g., two coarse pressure steps above the lowest single-phase pressure on the last isotherm. The extra pressure step may be desirable to allow for an upward-sloping envelope boundary.

From point 816, the path again descends along an isotherm, taking coarse pressure steps until a liquid phase is detected and a finer step to confirm the phase transition, before ascending with finer steps back along the isotherm until a single phase is again achieved. In addition to enabling finer resolution of the boundary location, the bi-directional travel along the isotherm enables the system to detect hysteresis, which may be an indication that insufficient equilibration time is being employed.

Upon returning to the single-phase condition, the system repeats the process on an even higher isotherm from point 818. On this isotherm the system is able to determine that the boundary now has a negative slope, and hence subsequent isotherms (e.g., from points 820, 822, and 824) may be followed with little or no elevation in pressure. As the slope of the envelope boundary becomes increasingly vertical, the system may begin directing the path along isobars after a fixed number of coarse steps (e.g., five) along an isotherm without a phase change. Thus, for example, from point 824, the path 808 makes five coarse descending steps without detecting the formation of a liquid phase. Upon reaching point 826, the path descends along an isobar until, at point 827, a liquid phase is detected. Because isobar traversal is expected to require more time than isotherm traversal, the path does not retrace the isobar from point 827. Instead, the path descends along an isotherm within the envelope, in this example, reaching point 828 after five steps without detecting a phase change. From point 828, the path ascends an isobar until the single-phase condition is again achieved at point 830. From 830, five downward steps are taken along an isotherm, reaching point 832 without a phase change. An isobar is followed until liquid phase formation is detected at point 834. Further traversals along isotherms and isobars yield phase change detections, and with each detection, the system switches between traversing along isobars and isotherms. By this stage, however, the system has gained enough information to accurately estimate the cricondenbar and cricondentherm of the shifted phase envelope, so the additional measurements offer diminishing returns for the effort.

Having traced out points on the phase envelope boundary, the system can then fit a curve 803 (optionally, a scaled version of the bulk fluid phase envelope) to these points. The points, the fitted curve 803, and/or the curve parameters may be displayed by the computer to the system operator, stored in an information storage medium for future use, and/or incorporated into reservoir models.

We have demonstrated the feasibility of using NMR techniques to measure phase behavior of fluids confined in porous media. We showed one example that the nanopores in gas shale can shift up the dew point by 115 psia for a modeled retrograde condensate system. This method can provide phase behavior measurement for fluids confined within microscopic pores of porous media. This measurement can't be achieved by conventional PVT method, which is currently the prevailing technology for phase behavior measurement.

NMR spectroscopic information can provide sufficient details to determine the molecular composition of hydrocarbon mixtures, and liquid saturation, at each phase point. For instance, this can be achieved using multi-nuclei NMR techniques, with one hydrocarbon composition monitored by 1H NMR and the second composition with isotopically enriched 13C independently monitored by 13C NMR. Each NMR channel (1H and 13C) can be independently calibrated against standards for quantification of each composition, and concurrently monitored through multi-channel NMR signal acquisition. See Wang, H. J., Kleinhammes, A., Tang, P., Xu, Y., & Wu, Y. (2013), Critical Role of Water in the Binding of Volatile Anesthetics to Proteins, The Journal of Physical Chemistry B, 117(40), 12007-12012. This can be further extended to more than two nuclei for monitoring more than two compositions independently, by switching between multiple NMR observation channels. Multi-nuclei techniques can also be combined with relaxation-based techniques and Laplace transformation analysis techniques, to determine the composition quantitatively.

Magnetic resonance imaging (MRI) technology is closely related to NMR technology. It employs the same principles, augmented with gradient fields for manipulating the static field to localize and move the measurement region within the sample, thereby obtaining spatially-resolved measurements that can be used to form images. This spatial resolution can reveal inhomogeneity within samples under investigation. This is a desirable feature as most of rock samples are inhomogeneous and anisotropic, and some rock samples possess fractures that occur naturally or during core handling. As a result, it may be important to know not only how nanopores are impacting the phase behavior, but also where those nanopores are located and how are they connected to the rest of pore system. MRI technology can identify the sweets spot in the rock sample that can hold up the most liquid, and any fractures that may exist in the sample. When the sample cell is configured with a flow loop, MRI technology can further monitor the transport kinetics of hydrocarbon liquid and gas flowing through rock samples. In such a process, any phase transition induced by nanopores may cause large perturbation on the flow, providing further insights for how to optimize production and recovery.

As previously mentioned, the disclosed techniques can be used for mapping out the phase envelope of many other subsurface systems, such as asphaltene precipitation and gas hydrate. This is made possible because NMR can capture very subtle changes in molecular dynamics, mutual interaction among molecules, and interaction with rock pore surface. In addition, the conditions that induce the phase transition are controlled independently from the NMR measurement. These features are applicable to any phase transition or similar process with sudden change in physical properties such as glass transition. Investigation of the different subsurface system behaviors may require modification of the in-situ loading system to achieve the control of conditions that trigger the different phase behaviors. The NMR technique remains applicable as long as the relevant molecules possess NMR active nuclei.

This written description uses examples to disclose the invention, including the best mode, and also to enable any person skilled in the art to make and use the invention. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims. It is understood that when combinations, subsets, groups, etc. of elements are disclosed (e.g., combinations of components in a composition, or combinations of steps in a method), that each of the various individual and collective combinations and permutations of these elements is specifically contemplated and supported by this disclosure.

All references cited herein are hereby expressly incorporated herein by reference. For the purposes of this specification and appended claims, unless otherwise indicated, all numbers expressing quantities, percentages or proportions, and other numerical values used in the specification and claims are to be understood as being modified in all instances by the term "about", meaning that, unless indicated to the contrary, the numerical parameters are approximations that can vary depending upon the desired properties sought to be obtained by the present invention. The reader should understand that such values are generally understood to refer to a range of numbers that one of ordinary skill in the art would consider as being within a reasonable amount of deviation from the recited numeric values (i.e., having the equivalent function or result). For example, this term can be construed as including a deviation of ±10 percent of the given numeric value provided such a deviation does not alter the end function or result of the value. Therefore, a value of about 1% can be construed to be a range from 0.9% to 1.1%.

It is further noted that, as used in this specification and the appended claims, the singular forms "a", "an", and "the", include plural references unless expressly and unequivocally limited to one referent. As used herein, the term "include" and its grammatical variants are intended to be non-limiting, such that recitation of items in a list is not to the exclusion of other like items that can be substituted or added to the listed items. The terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. Unless otherwise defined, all terms, including technical and scientific terms used in the description, have the same meaning as commonly understood by one of ordinary skill in the art to which this invention belongs.

Those of ordinary skill in the art will appreciate that various modifications may be made to the embodiments and the claims provided herein. For example, one or more computer implemented method claims, including corresponding apparatus and computer readable medium claims, may be included herein. A computer may be practically any computing system and may include at least one processor and at least one memory. As another example, the computer may be integral with the apparatus discussed herein, for example, a computer may be integral with the NMR system. Additionally or alternatively, a standalone computer may also be coupled to the apparatus provided herein.

Regarding the computer, the computer may include a processor communicatively connected to a memory via a data bus. The processor can be any of a variety of types of programmable circuits capable of executing computer-readable instructions to perform various tasks, such as mathematical and communication tasks. The "computer" may be a computing system, a computer, a wireless device, a wired device, a plurality of networked devices, etc.

The memory can include any of a variety of memory devices, such as using various types of computer-readable or computer storage media. A computer storage medium or computer-readable medium may be any medium that can contain or store the program for use by or in connection with the instruction execution system, apparatus, or device. By way of example, computer storage media may include dynamic random access memory (DRAM) or variants thereof, solid state memory, read-only memory (ROM), electrically-erasable programmable ROM, optical discs (e.g., CD-ROMs, DVDs, etc.), magnetic disks (e.g., hard disks, floppy disks, etc.), magnetic tapes, and other types of devices and/or articles of manufacture that store data. Computer storage media generally includes at least one or more tangible media or devices. Computer storage media can, in some embodiments, include embodiments including entirely non-transitory components. The memory may also store an application to carry out embodiments described herein. The application may even include at least one component to handle various aspects of the embodiments described herein.

The computer can also include a communication interface configured to receive data. The communication interface may also be configured to transmit data. The data may be the data discussed herein.

Additionally, the computer may include a display for presenting a user interface associated with the application. In various embodiments, the computer can include additional components, such as peripheral I/O devices, for example, to allow a user to interact with the user interface associated with the application. For example, the display and the peripheral I/O devices may allow a user to provide user input, view and edit settings, manipulate data, or other functionality. In some embodiments, the user may even provide at least a portion of the data via the user interface. In various embodiments, the computer may also allow for interaction with at least one other software item, at least one other hardware item, or both.

In short, those of ordinary skill in the art will appreciate that various modifications may be made to the computer and the scope of the claims is not limited to the discussion herein. For example, those of ordinary skill in the art will appreciate that the inventive principles may be implemented using automated steps only or using a combination of automated steps and manual steps. Embodiments of the present disclosure can be implemented, for example, as a computer process (method), process (method), a computer or a computing system, or as an article of manufacture, such as a computer program product or computer readable media. The term computer readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computer, above. Computer storage media does not include a carrier wave or other propagated or modulated data signal. In some embodiments, the computer storage media includes at least some tangible features; in many embodiments, the computer storage media includes entirely non-transitory components.

The description and illustration of one or more embodiments provided in this application are not intended to limit or restrict the scope of the invention as claimed in any way. The embodiments, examples, and details provided in this disclosure are considered sufficient to convey possession and enable others to make and use the best mode of claimed invention. The claimed invention should not be construed as being limited to any embodiment, example, or detail provided in this application. Regardless whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate embodiments falling within the spirit of the broader aspects of the claimed invention and the general inventive concept embodied in this application that do not depart from the broader scope. For instance, such other examples are intended to be within the scope of the claims if they have structural or methodological elements that do not differ from the literal language of the claims, or if they include equivalent structural or methodological elements with insubstantial differences from the literal languages of the claims, etc.

Numerous other alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. A nuclear magnetic resonance (NMR) pore-fluid phase characterization system that comprises:
    a NMR sample cell that receives a porous medium for exposure to a fluid;
    a pressure control system that supplies the fluid to the NMR sample cell with a controllable fluid pressure;
    a temperature control system that controls a fluid temperature of the fluid in the NMR sample cell;
    a NMR probe that collects NMR signal measurements from nuclei of the fluid in the NMR sample cell; and
    a computer that derives, from the collected NMR signal measurements, a measured NMR parameter distribution as a function of fluid pressure and fluid temperature along a measured pressure-temperature path that crosses a phase boundary, said crossing being detected as a change in the measured NMR parameter distribution.

2. The NMR system of claim 1, wherein the measured NMR parameter distribution is a distribution over chemical shift, spin-lattice relaxation time (T1), spin-lattice relaxation time in rotating frame (T1ρ), spin-spin relaxation time (T2), diffusion coefficient ($D_s$), or any combination thereof for one or more nuclei types in a set consisting of 1H, 2H, 3H, 13C, 14N, 15N, 17O, 19F, 33S, 129Xe, and wherein said change is to one or more of: a peak position, a peak amplitude, a peak width, and a peak shape.

3. The NMR system of claim 1, wherein said measured NMR parameter distribution is a chemical shift of 1H, and wherein said change is to a peak width in the measured NMR parameter distribution.

4. The NMR system of claim 3, wherein the computer compares the peak width to a threshold, and wherein a width below the threshold indicates an absence of a liquid phase.

5. The NMR system of claim 1, wherein the porous medium is a plug or powder from a subterranean formation.

6. The NMR system of claim 5, wherein the porous medium comprises shale.

7. The NMR system of claim 1, wherein the fluid is a reservoir fluid sampled from a subterranean formation.

8. The NMR system of claim 1, wherein the fluid is a mixture of multiple hydrocarbon components.

9. The NMR system of claim 8, wherein the phase boundary is part of a phase envelope around a pressure-temperature region having multiple fluid phases.

10. The NMR system of claim 1, wherein the path crosses the phase boundary along an isotherm from a single-phase region.

11. The NMR system of claim 10, wherein the path crosses the phase boundary along multiple isotherms.

12. The NMR system of claim 11, wherein part of the path alternately crosses the phase boundary along isobars and isotherms, the computer detecting each crossing.

13. The NMR system of claim 1, further comprising one or more gradient magnets that shift(s) a measurement volume of the NMR probe within the NMR sample cell, and wherein the computer derives the measured NMR parameter distribution as a function of position in order to characterize fluid inhomogeneity in the porous medium.

14. A nuclear magnetic resonance (NMR) pore-fluid phase characterization method that comprises:
 (a) loading a fluid into a NMR sample cell containing a porous medium;
 (b) setting a pressure and a temperature for the fluid in the NMR sample cell;
 (c) applying a radio-frequency (RF) pulse sequence to the fluid in the NMR sample cell in order to acquire a NMR signal at the set pressure and the set temperature;
 (d) deriving from the acquired NMR signal a measured NMR parameter distribution with a computer that depends on the set pressure and the set temperature;
 (e) determining with the computer or by user observation whether a fluid phase is present based on the acquired and measured NMR parameter distribution;
 (f) varying one or more of the set pressure, the set temperature, or both and repeating the measurements of operations (b) through (f) in order to determine the presence or absence of the fluid phase at multiple measurement points along a measured pressure-temperature path that crosses a phase boundary; and
 (g) providing a newly measured plot of the location of the phase boundary based on the presence or absence of the fluid phase at each of the measured points.

15. The NMR method of claim 14, wherein said providing includes displaying at least a portion of a phase envelope delineating a single phase region from a multiple phase region of a pressure-temperature phase diagram.

16. The NMR method of claim 15, wherein the fluid is a mixture having at least one hydrocarbon component.

17. The NMR method of claim 14, wherein the measured NMR parameter distribution is an NMR spectrum, and said determining includes comparing a peak width in the NMR spectrum to a threshold.

18. The NMR method of claim 14, wherein the path crosses the phase boundary along at least one isotherm from a single-phase region.

19. The NMR method of claim 14, wherein the path re-crosses the phase boundary along at least one isotherm from a multiple phase region to improve location accuracy.

20. The NMR method of claim 14, further comprising: scanning a measurement point to image fluid inhomogeneity in the porous medium.

* * * * *